(12) United States Patent
Haas et al.

(10) Patent No.: US 8,350,563 B2
(45) Date of Patent: Jan. 8, 2013

(54) MAGNETIC FIELD SENSOR AND METHOD USED IN A MAGNETIC FIELD SENSOR THAT ADJUSTS A SENSITIVITY AND/OR AN OFFSET OVER TEMPERATURE

(75) Inventors: David J. Haas, Weare, NH (US); Ravi Vig, Bow, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 275 days.

(21) Appl. No.: 12/902,410

(22) Filed: Oct. 12, 2010

(65) Prior Publication Data

US 2012/0086442 A1 Apr. 12, 2012

(51) Int. Cl.
*G01N 27/72* (2006.01)
(52) U.S. Cl. ........................ 324/225; 324/202
(58) Field of Classification Search .................. 324/202, 324/225
See application file for complete search history.

(56) References Cited

U.S. PATENT DOCUMENTS

| | | | |
|---|---|---|---|
| 6,781,359 B2 | 8/2004 | Stauth et al. | |
| 7,265,531 B2 | 9/2007 | Stauth et al. | |
| 2006/0224350 A1 | 10/2006 | Tanizawa | |
| 2008/0074106 A1 | 3/2008 | Oohira | |

OTHER PUBLICATIONS

Foletto et al,; "Magnetic Field Sensor and Associated Method That Can Establish a Measured Threshold Value and That Can Store the Measured Threshold Value in a Memory Device;" U.S. Appl. No. 13/345,021, filed Jan. 6, 2012; 37 pages.
Melexis MLX 90324; ""Under-the-Hood" Triaxis Rotary Position feat. SENT Protocol;" 3901090324 Data Sheet; Dec. 2008; 40 pages.
PCT Sarch Report and Written Opinion dated Nov. 14, 2011; for PCT Pat. App. No. PCT/US2011/051493; 12 pages.
Allegro Microsystems, Inc.; Design Intent Data Sheet; A1340; "High Precision, Highly Programmable Linear Hall Effect Sensor IC with EEPROM and Analog Output with Advanced Output Linearization Capabilities;" Sep. 10, 2009; pp. 1-40.
Allegro Microsystems, Inc.; Design Intent Data Sheet; A1341; "High Precision, Highly Programmable Linear Hall Effect Sensor IC with EEPROM, Output Protocols SENT and PWM, and Advanced Output Linearization Capabilities;" May 17, 2010; pp. 1-46.

*Primary Examiner* — Bot Ledynh
(74) *Attorney, Agent, or Firm* — Daly, Crowley, Mofford & Durkee, LLP (57) ABSTRACT

A magnetic field sensor and a method associated with the magnetic field sensor provide gain correction coefficients and/or offset correction coefficients stored in the magnetic field sensor in digital form. The gain correction coefficients and/or offset correction coefficients can be used to generate analog control signals to control a sensitivity and/or an offset of an analog signal path through the magnetic field sensor.

20 Claims, 5 Drawing Sheets

MAGNETIC FIELD SENSOR AND METHOD USED IN A MAGNETIC FIELD SENSOR THAT ADJUSTS A SENSITIVITY AND/OR AN OFFSET OVER TEMPERATURE

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor that can adjust a gain and/or an offset in response to a sensed temperature.

BACKGROUND OF THE INVENTION

As is known, magnetic field sensors can be used in a variety of applications. In one application, a magnetic field sensor can be used to sense an electrical current. One type of current sensor uses a Hall effect magnetic field sensing element in proximity to a current-carrying conductor. The Hall effect magnetic field sensing element generates an output signal having a magnitude proportional to the magnetic field induced by the current through the conductor. Typical current sensors of this type include a gapped toroid magnetic flux concentrator, with the Hall effect device positioned in a toroid gap. The Hall effect device and toroid are assembled in a housing, which is mountable on a printed circuit board. In use, a separate current-carrying conductor, such as a wire, is passed through the center of the toroid and is soldered to the printed circuit board, such as by soldering exposed ends of the wire to plated through-holes.

Other configurations of current sensors are known. Other configurations of current sensors are described in U.S. Pat. No. 6,781,359, issued Aug. 24, 2004 and U.S. Pat. No. 7,265,531, issued Sep. 4, 2007, both of which are assigned to the assignee of the present invention and both of which are incorporated by reference herein in their entireties.

Various parameters characterize the performance of magnetic field sensors, e.g., current sensors. For example, a sensitivity of a magnetic field sensor is a change in the output signal of the magnetic field sensor in proportion to a magnetic field experienced by the magnetic field sensor. For another example, an offset voltage is an unwanted DC offset voltage of an output signal from the magnetic field sensor, normally biased at the power supply of the magnetic field sensor divided by two, for example, five volts divided by two or 2.5 Volts. For another example, a linearity is the degree to which the output signal of a magnetic field sensor varies in direct linear proportion to the magnetic field (e.g., current) experienced by the magnetic field sensor.

It is known that some types of magnetic field sensors tend to have sensitivities and offsets that vary with temperature. Sensitivity variation tends to be related to a stress and/or strain imparted on a magnetic field sensing element used in the magnetic field sensor, for example, upon a Hall effect element, as temperature changes, for example, due to expansion or contraction of packaging of the magnetic field sensor or of the substrate on which the magnetic field sensing element is disposed. Offset variation tends to be related to temperature variable characteristics of amplifiers used in the magnetic field sensor.

Magnetic field sensors sometimes employ analog compensation techniques that can adjust gain (i.e., sensitivity) and/or offset with respect to temperature, for example, using varistors or the like. Such techniques can result in sensitivities and offsets that are fairly invariant with respect to temperature, but often at the expense of room temperature accuracy of sensitivity or offset. Furthermore, analog compensation techniques are fixed and not suited for production or field changes to the compensation.

Magnetic field sensors with digital circuits tend to be slower than magnetic field sensors with analog circuits. In other words, magnetic field sensors with digital circuits cannot respond well to rapidly changing magnetic fields (e.g., due to rapidly changing currents).

It would be desirable to provide a magnetic field sensor with the speed advantages of analog circuits yet using a different technique for sensitivity and offset correction versus temperature.

SUMMARY OF THE INVENTION

The present invention provides a magnetic field sensor with an analog signal path that is corrected for sensitivity and/or offset by digital circuits. This arrangement achieves the rapid response time of analog circuits, achieves sensitivity and/or offset accuracy, particularly at room temperature, and achieves production (or field) changeability without production perturbations.

In accordance with one aspect of the present invention, a magnetic field sensor includes a magnetic field sensing element configured to generate a magnetic field signal. The magnetic field sensor also includes a gain adjustable analog circuit coupled to receive a signal representative of the magnetic field signal, coupled to receive a gain control signal, and configured to generate a gain adjusted signal having a gain responsive to the gain control signal. The magnetic field sensor also includes a coefficient table memory configured to receive and store a plurality of gain correction coefficients. Pairs of the plurality of gain correction coefficients are associated with boundaries of respective temperature segments, each temperature segment bounded by a pair of temperatures. The magnetic field sensor also includes a temperature sensor configured to generate a temperature signal representative of a temperature. The magnetic field sensor also includes a segment processor coupled to receive a signal representative of the temperature signal, configured to identify a temperature segment in which the temperature signal falls, coupled to receive a pair of gain correction coefficients associated with the identified temperature segment, and configured to interpolate between the pair of gain correction coefficients in accordance with the temperature signal to generate an interpolated gain correction value, wherein the gain control signal is an analog signal related to the interpolated gain correction value.

In accordance with another aspect of the present invention, a method of adjusting a magnetic field sensor includes measuring a temperature with the magnetic field sensor during field operation. The method also includes identifying with the magnetic field sensor in which one of a predetermined plurality of temperature segments the field measured temperature lies. The method also includes identifying with the magnetic field sensor a pair of predetermined calibration temperatures associated with boundaries of the identified temperature segment. The method also includes identifying with the magnetic field sensor a pair of gain calibration coefficients associated with the boundaries of the identified temperature segment, the pair of gain calibration coefficients stored within the magnetic field sensor. The method also includes interpolating with the magnetic field sensor between the pair of gain calibration coefficients to establish an interpolated gain correction value. The method also includes applying an analog signal related to the interpolated gain correction value to a gain adjustment circuit within the magnetic field sensor.

In accordance with another aspect of the present invention, a magnetic field sensor includes a magnetic field sensing element configured to generate a magnetic field signal. The magnetic field sensor also includes an offset adjustable analog circuit coupled to receive a signal representative of the magnetic field signal, coupled to receive an offset control signal, and configured to generate an offset adjusted signal having an offset responsive to the offset control signal. The magnetic field sensor also includes a coefficient table memory configured to receive and store a plurality of offset correction coefficients. Pairs of the plurality of offset correction coefficients are associated with boundaries of respective temperature segments, each temperature segment bounded by a pair of temperatures. The magnetic field sensor also includes a temperature sensor configured to generate a temperature signal representative of a temperature. The magnetic field sensor also includes a segment processor coupled to receive a signal representative of the temperature signal, configured to identify a temperature segment in which the temperature signal falls, coupled to receive a pair of offset correction coefficients associated with the identified temperature segment, and configured to interpolate between the pair of offset correction coefficients in accordance with the temperature signal to generate an interpolated offset correction value. The offset control signal is an analog signal related to the interpolated offset correction value.

In accordance with another aspect of the present invention, a method of adjusting a magnetic field sensor includes measuring a temperature with the magnetic field sensor during field operation. The method also includes identifying with the magnetic field sensor in which one of a predetermined plurality of temperature segments the field measured temperature lies. The method also includes identifying with the magnetic field sensor a pair of predetermined calibration temperatures associated with boundaries of the identified temperature segment. The method also includes identifying with the magnetic field sensor a pair of offset calibration coefficients associated with the boundaries of the identified temperature segment, the pair of offset calibration coefficients stored within the magnetic field sensor. The method also includes interpolating with the magnetic field sensor between the pair of offset calibration coefficients to establish an interpolated offset correction value. The method also includes applying an analog signal related to the interpolated offset correction value to an offset adjustment circuit within the magnetic field sensor.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most types of magnetoresistance elements tend to have axes of maximum sensitivity parallel to the substrate and most types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While magnetic field sensors having Hall effect elements are shown and described in examples below, the same techniques can be applied to a magnetic field sensor having any type of magnetic field sensing element. However, it is known that Hall effect elements tend to be particularly sensitive to stress and strains imparted upon the Hall effect element by temperature excursions, the stresses and strains tending to impart changes in sensitivity of the Hall effect elements.

Current sensors are shown and described in examples, below. However, the same techniques can be applied to any magnetic field sensor, and, desirably, to any magnetic field sensor that experiences temperature excursions.

Current sensors without flux concentrators are shown and described in examples below. It will be understood that the use of a flux concentrator tends to increase sensitivity of a magnetic field sensor. Circuits and techniques described below can also be used with magnetic field sensors having flux concentrators.

Other configurations of current sensors to which this invention applies are described in U.S. Pat. No. 6,781,359, issued Aug. 24, 2004 and U.S. Pat. No. 7,265,531, issued Sep. 4, 2007, both of which are assigned to the assignee of the present invention and both of which are incorporated by reference herein in their entireties.

Figure 1:
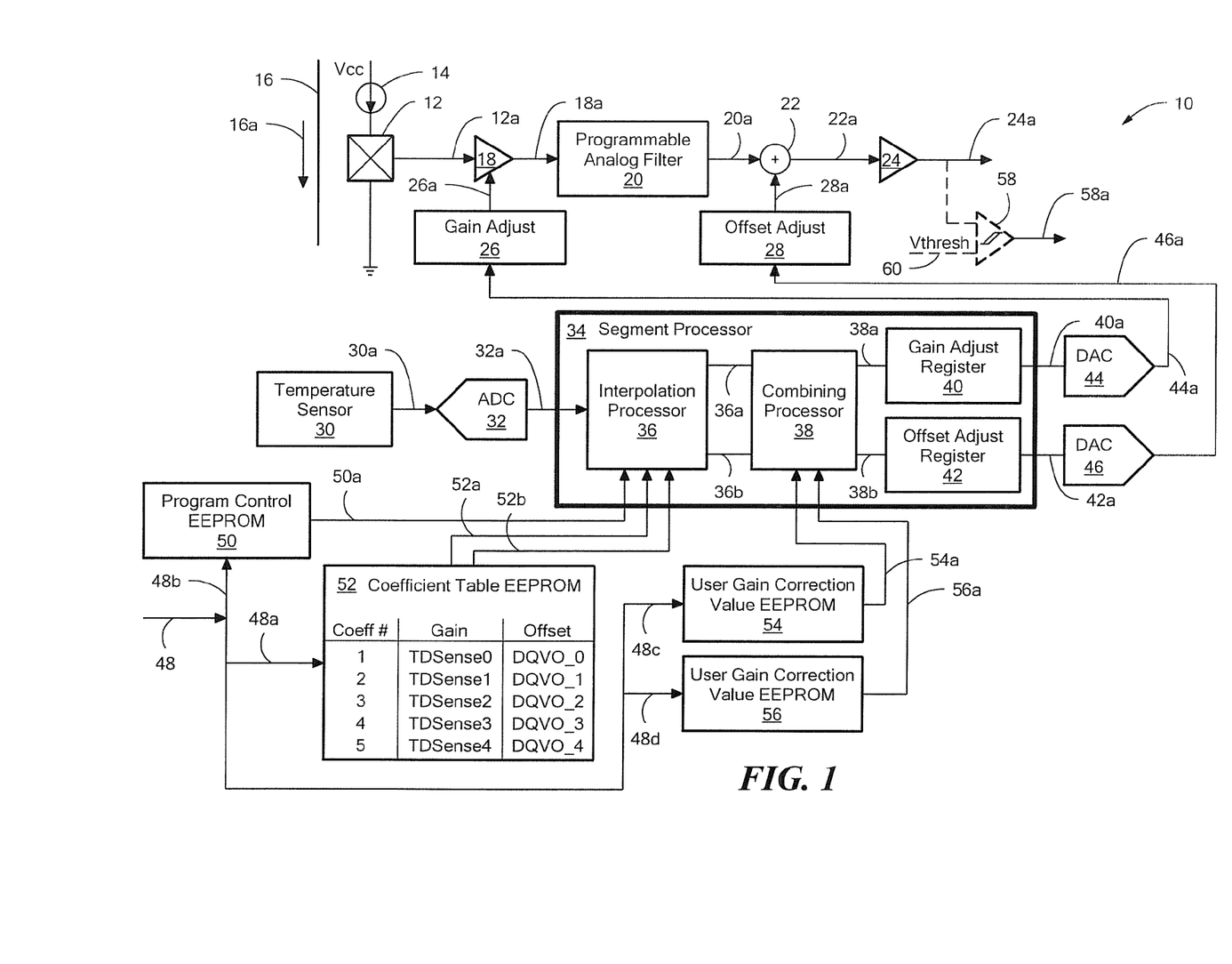
FIG. 1 is a block diagram showing a magnetic field sensor used to sense a current and having a digital segment processor to correct analog gain and/or offset variations versus temperature.

Referring to FIG. 1, a magnetic field sensor 10 includes a Hall effect element 12 driven by a current source 14. The Hall effect element 12 is responsive to a magnetic field as may be generated, for example, by a current 16a passing through a current-carrying conductor 16 proximate to the hall effect element 12. The current-carrying conductor 16 can be a part of the magnetic field sensor 10, or it can be external to the magnetic field sensor 10.

The magnetic field sensor 10 includes an analog signal path comprised of an amplifier 18, a filter 20, which can be a programmable filter, a summing circuit 22, and an amplifier 24. The Hall effect element 12 is configured to generate a magnetic field signal 12a responsive to the magnetic field. The amplifier 18 (a gain adjustable analog circuit) is coupled to receive the magnetic field signal 12a and to receive a gain control signal 26a and configured to generate a gain adjusted signal 18a. The filter 20 is coupled to receive the gain adjusted signal 18a and configured to generate a filtered signal 20a. The summing circuit 22 (an offset adjustable analog circuit) is coupled to receive the filtered signal 20a and to receive an offset control signal 28a and configured to generate an offset adjusted signal 22a. The amplifier 24a is coupled to receive the offset adjusted signal 22a and configured to generate an output signal 24a having gain and offset correction.

The magnetic field sensor 10 also includes a temperature sensor 30, preferably disposed on the same substrate as other circuits of the magnetic field sensor 10. The temperature sensor 30 is configured to generate a temperature signal 30a representative of a temperature experienced by the temperature sensor 30. An analog-to-digital converter (ADC) 32 is coupled to receive the temperature signal 30a and configured to generate a digital temperature signal 32a representative of the temperature signal 30a.

The magnetic field sensor 10 can include a segment processor 34 coupled to receive the digital temperature signal 32a. It will become apparent from discussion below that the segment processor 34 is configured to perform several functions. The segment processor 34 is configured to identify a temperature segment in which the digital temperature signal 32a, (i.e. the temperature signal 30a) falls. The segment processor 34 can also be coupled to receive a pair of gain correction coefficients 52a and/or a pair of offset correction coefficients 52b associated with the identified temperature segment. The pair of gain correction coefficients 52a and/or pair of offset correction coefficients 52b are associated with temperatures that bound the identified temperature segment. The pair of gain correction coefficients 52a and/or pair of offset correction coefficients 52b can be requested by the segment processor 34.

The segment processor 34 can be configured to interpolate between the pair of gain correction coefficients 52a in accordance with the digital temperature signal 32a to generate a sensor gain correction value 40a. The gain control signal 26a is an analog signal related to and determined by the sensor gain correction value 40a.

The segment processor 34 can also be configured to interpolate between the pair of offset correction coefficients 52b in accordance with the digital temperature signal 32a to generate a sensor offset correction value 42a. The offset control signal 46a is an analog signal related to and determined by the sensor offset correction value 42a.

It will be understood that the segment processor 34 is a digital circuit that process digital signals or values. The segment processor 34 controls gain and/or offset of the analog circuits described above.

The magnetic field sensor 10 can include an EEPROM 52 configured to hold a plurality of gain correction coefficients and/or a plurality of offset correction coefficients, each associated with a respective one of a plurality of selected temperatures. In some embodiments, there are five selected temperatures, each associated with a respective gain correction coefficient (TDSense) and a respective offset correction coefficient (DQVO).

The plurality of gain correction coefficients and the plurality of offset correction coefficients can be stored in the EEPROM 52 at the time of manufacture of the magnetic field sensor 10, or at any time thereafter, via a signal 48a upon a communication link 48, which can be a serial communication link. A method of establishing the plurality of gain correction coefficients and the plurality of offset correction coefficients is described below in conjunction with FIG. 5.

The magnetic field sensor 10 can also include a user gain correction EEPROM 54 coupled to provide a user gain correction value 54a to the segment processor 34. The magnetic field sensor 10 can also include a user offset EEPROM 56 coupled to provide a user offset correction value 56a to the segment processor 34. The user gain EEPROM 54 can receive the user gain correction value 54a via a signal 48c upon the communication link. The user offset EEPROM 56 can receive the user offset correction value 56a via a signal 48d upon the communication link.

The magnetic field sensor 10 can also include a program control EEPROM 50 coupled to provide an interpolation control signal 50a to the segment processor 34. Interpolation control is described more fully below. The program control EEPROM 50 can receive the interpolation control signal 50a via a signal 48b upon the communication link.

The segment processor 34 can include an interpolation processor 36 coupled to receive the digital temperature signal 32a and coupled to receive the pair of gain correction coefficients 52a and/or the pair of offset correction coefficients 52b. In some embodiments, the interpolation processor 36 can also be coupled to receive the control signal 50a. The control signal 50a can determine a type of gain and/or offset interpolation to be performed by the interpolation processor 36. Types of interpolation are further described below.

The interpolation processor 36 is configured to generate an interpolated gain correction value 36a and/or an interpolated offset correction value 36b. To this end, the interpolation processor 36 is coupled to receive the digital temperature signal 32a and configured to identify the above-described temperature segment in which the digital temperature signal 32a, (i.e. the temperature signal 30a) falls. The interpolation processor 36 is also coupled to receive the above-described pair of gain correction coefficients 52a and/or the above-described pair of offset correction coefficients 52b associated with two temperatures that bound the identified temperature segment.

The interpolation processor 36 can use the digital temperature signal 32a to identify in which one of the plurality of temperature segments the measured temperature lies. Accordingly, the proper pair of gain correction coefficients 52a and/or the pair of offset correction coefficients 52b can be requested by the interpolation processor 36.

The magnetic field sensor 10 can include a combining processor 38 coupled to receive the interpolated gain correction value 36a and/or the interpolated offset correction value 36b and coupled to receive the user gain correction value 54a and/or the user offset correction value 56a. The combining processor is configured to combine the interpolated gain correction value 36a with the user gain correction value 54a and/or to combined the interpolated offset correction value 36b with the user offset correction value 56a. Accordingly, the combining processor 38 is configured to generate a combined gain correction value 38a and/or a combined offset correction value 38b, which can be stored in a gain adjust register 40 and an offset adjust register 42, respectively.

A digital-to-analog converter (DAC) 44 can be coupled to receive the stored gain correction value 40a and configured to generate a gain correction signal 44a received by a gain adjust circuit 26 configured to generate the gain control signal 26a accordingly. A DAC 46 can be coupled to receive the stored offset correction value 42a and configured to generate an offset correction signal 46a received by an offset adjust circuit 28 configured to generate the offset control signal 28a accordingly.

In one particular embodiment, the gain interpolation performed by the interpolation processor 36 to achieve the interpolated gain correction value 36a is a linear interpolation of the form:

$$SNS_{OUT} = \frac{CoeffB - CoeffA}{32} * \text{temp}[4:0] + CoeffA \quad (1)$$

where: CoeffA and CoeffB are the pair of gain correction coefficients 52a bounding the identified temperature segment; and temp[4:0] represents the five least significant bits of the digital temperature signal 32a, which can be a seven bit value.

In some embodiments, the interpolation processor 36 holds a plurality of gain (sensitivity) processing options and the processing option (the interpolation type, i.e., the equation above) is selected in accordance with the control signal 50a.

In some embodiments, the combining processor 38 combines the interpolated gain correction value 36a with the user gain correction value 54a according to an equation below to, resulting in the combined gain correction value 38a:

$$SNS_{OUT} = \left[\left[\frac{CoeffB - CoeffA}{32} * \text{temp}[4:0] + CoeffA\right] * (SENS_{FINE} + K_{DEV})\right] - K_{DEV} \quad (2)$$

where: $SENS_{FINE}$ is the user gain correction value 54a; and
$K_{DEV}$ is a device specific constant representative of a sensitivity of the particular type of magnetic field sensor (e.g., decimal 74 or decimal 206)

In one particular embodiment, the offset interpolation performed by the interpolation processor 36 to achieve the interpolated offset correction value 36b is a linear interpolation of the form:

$$QVO_{OUT} = \frac{CoeffB - CoeffA}{32} * \text{temp}[4:0] + CoeffA \quad (3)$$

where: CoeffA and CoeffB are the pair of offset correction coefficients 52b bounding the identified temperature segment; and temp[4:0] represents the five least significant bits of the digital temperature signal 32a, which can be a seven bit value.

In some embodiments, the interpolation processor 36 holds a plurality of offset processing options and the processing option (the interpolation type, i.e., the equation above) is selected in accordance with the control signal 50a. In some embodiments the selection can select among the following linear interpolation types, each differing by a factor of two (a one bit shift).

$$QVO_{OUT} = \frac{\frac{CoeffB - CoeffA}{32} * \text{temp}[4:0] + CoeffA}{2} \quad (4)$$

$$QVO_{OUT} = \frac{CoeffB - CoeffA}{32} * \text{temp}[4:0] + CoeffA \quad (5, \text{same as } 3)$$

$$\left[\frac{CoeffB - CoeffA}{32} * \text{temp}[4:0] + CoeffA\right] * 2 \quad (6)$$

In some embodiments, the combining processor 38 combines the interpolated offset correction value 36b with the user offset correction value 56a according to an equation below to, resulting in the combined offset correction value 38a:

$$QVO_{OUT} = \frac{CoeffB - CoeffA}{32} * \text{temp}[4:0] + CoeffA + QVO \quad (7)$$

where: QVO is the user offset correction value 56a.

It should be apparent from the above gain and offset equations that the user gain correction value 54a is applied in a product and the user offset correction value 56a is applied in a sum, as would be expected.

In some alternate embodiments, for example, when the magnetic field sensor 10 is used as a magnetic switch responsive to a proximity of a ferromagnetic object, the magnetic field sensor 10 can include a comparator 58 coupled to receive the signal 24a, coupled to receive a threshold signal 60, and configured to generate a comparison signal 58a. The comparison signal 58a can be a two state signal that can indicate the proximity or lack of proximity to the ferromagnetic object.

Figure 2:
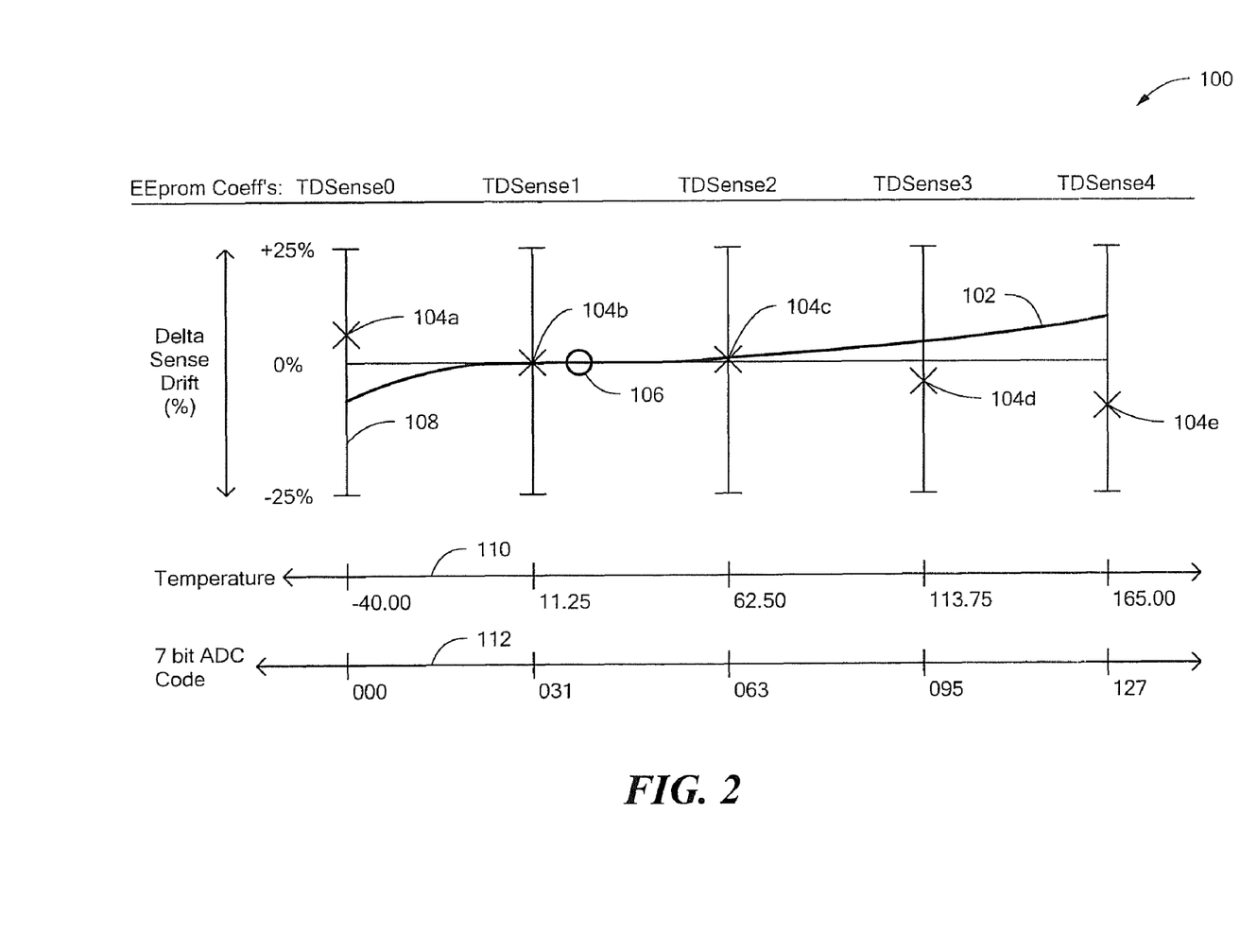
FIG. 2 is a graph showing an exemplary characteristic curve of sensitivity versus temperature of a magnetic field sensor and showing gain correction coefficients.

Referring now to FIG. 2, a graph 100 has a vertical axis 108 with a scale in units of sensitivity change in percent. A first horizontal axis 110 has a scale in units of temperature in degrees Celsius experienced by a magnetic field sensor (i.e., by the temperature sensor 30 of FIG. 1) and a second horizontal axis 112 has a scale in units corresponding to a seven bit digital code representative of temperature, but in decimal units from zero to one hundred twenty seven. The axis 112 corresponds to the digital temperature signal 32a of FIG. 1.

A characteristic curve 102 is representative of a relative sensitivity (relative to sensitivity at room temperature 106) of a magnetic field sensor having no gain correction values applied. It can be seen that the relative sensitivity represented by the characteristic curve 102 tends to be lower at low and tends to be higher at high temperatures.

At a first temperature, −40 degrees Celsius, a gain correction coefficient 104a (TDSense0) is opposite from the relative sensitivity drop of the characteristic curve 102. It will be understood that the gain correction coefficient 104a can be applied to the magnetic field sensor when the magnetic field sensor experiences the temperature of −40 degrees, resulting in essentially no sensitivity change from the sensitivity at room temperature 106. Similarly, other gain correction coefficients 104b, 104c, 104d, 104e (TDSense1, TDSense2, TDSense3, TDSense4, respectively) can be applied at other temperatures with which they are associated (11.25, 62.5, 113.75, 165.00 degrees Celsius, respectively) in order to provide no sensitivity change from the sensitivity at room temperature 106 at those particular temperatures.

Five temperature segments are shown, namely −40.00 to 11.25, 11.25 to 62.5, 62.5 to 113.75, and 113.75 to 165.00 degrees Celsius.

Within any temperature segment, e.g., the temperature segment 11.25 to 62.5, identified in accordance with an actual measured temperature experienced by the magnetic field sensor as represented by the digital temperature signal 32a of FIG. 1, the interpolation processor 36 (FIG. 1) can interpolate between the gain correction coefficients (e.g., 104b, 104c) associated with boundaries of the identified temperature segment to establish an interpolated gain correction value (e.g., 36a, FIG. 1) to be used at the particular measured temperature. The interpolated gain correction value can be applied to the magnetic field sensor 10 to keep the sensitivity of the magnetic field sensor essentially unchanged from the sensitivity at room temperature 106.

As shown and described above, the sensitivity interpolation can be a linear interpolation. However in other embodiments, the gain interpolation can be of another form, for example, a quadratic interpolation.

While five gain correction coefficients 104a-104e are shown and five associated temperature segments, in other embodiments, there can be more than five or fewer than five gain correction coefficients and associated temperature segments. The number of gain correction coefficients and associated temperature segments can be selected according to a desired accuracy and according to a desired largest physical size of the EEPROM 52 (FIG. 1) that stores the gain correction coefficients. In general, the greater the number of gain correction coefficients that are stored in the EEPROM 52, the more accurate will be the interpolated gain correction coefficients and the more accurate will be the corrected relative sensitivity of the magnetic field sensor.

While the temperature segments are shown to be equal in numbers of degrees, in other embodiments, the temperature segments can have an unequal number of degrees. For example, in some embodiments, temperature segments near to room temperature 106 can have a larger (or smaller) temperature span than temperature segments further from room temperature 106.

Each individual magnetic field sensor of a particular type can have different gain correction coefficients 104a-104e generated by a process more fully described below in conjunction with FIG. 5. However, in some embodiments, each one of a particular type of magnetic field sensor can have the same gain correction coefficients 104a-104e.

As further described below in conjunction with FIG. 5, some of (or all of) the gain correction coefficients 104a-104e can be selected (i.e., measured) during production of the magnetic field sensor (or thereafter) by direct measurements of relative sensitivity at the plurality of temperatures of the specific one of the magnetic field sensors in which the specific gain correction coefficients 104a-104e are stored. However in some embodiments, fewer than all of the gain correction coefficients 104a-104e result from direct measurements and other ones of the gain correction coefficients 104a-104e are derived from the sensitivity characteristic curve 102. In other words, for example, the gain correction coefficient 104a can be generated by a relative sensitivity measurement at −40.00 degrees and at room temperature 106, and other ones of the gain correction coefficients 104b-104e can be deduced by knowledge of a shape of the sensitivity characteristic curve 102.

The characteristic curve 102 as shown can be representative of an average sensitivity characteristic taken from a plurality of the same type of magnetic field sensor. Other types of magnetic field sensors can have characteristic curves with other shapes.

In using the characteristic curve 102 to derive some (or all) of the gain correction coefficients 104a-104e for a particular magnetic field sensor, it should be understood that the characteristic curve 102 can keep the same shape common to all of the same type of magnetic field sensors, but can be scaled up or down in magnitude for each individual magnetic field sensor of the same type. For example, if the relative sensitivity of an individual magnetic field sensor is measured at room temperature and also at −40 degrees, and if the relative sensitivity at −40 degrees is lower than that represented by the characteristic curve 102, it can be presumed that the characteristic curve of the magnetic field sensor being measured curves more downward at −40 degrees and more upward at 165 degrees, but otherwise maintains the same shape. Thus, by making only a room temperature sensitivity measurement and also a relative sensitivity measurement at any other temperature (relative to sensitivity at room temperature), a characteristic curve similar to (same shape as) the characteristic curve 102 (but with different scaling) can be derived and the other gain correction coefficients can be deduced.

It will be understood that the particular shape of the sensitivity characteristic curve 102 depends upon the particular type magnetic field sensor. Furthermore, the characteristic curve 102 can be slightly different (scaling) for different specific ones of the particular type of magnetic field sensor. Therefore, it may be advantageous to characterize a plurality of different specific ones of the particular type of magnetic field sensor, and take an average in order to identify the shape of the characteristic curve 102, which can thereafter be scaled up or down to suit each individual magnetic field sensor of the same type.

Figure 3:
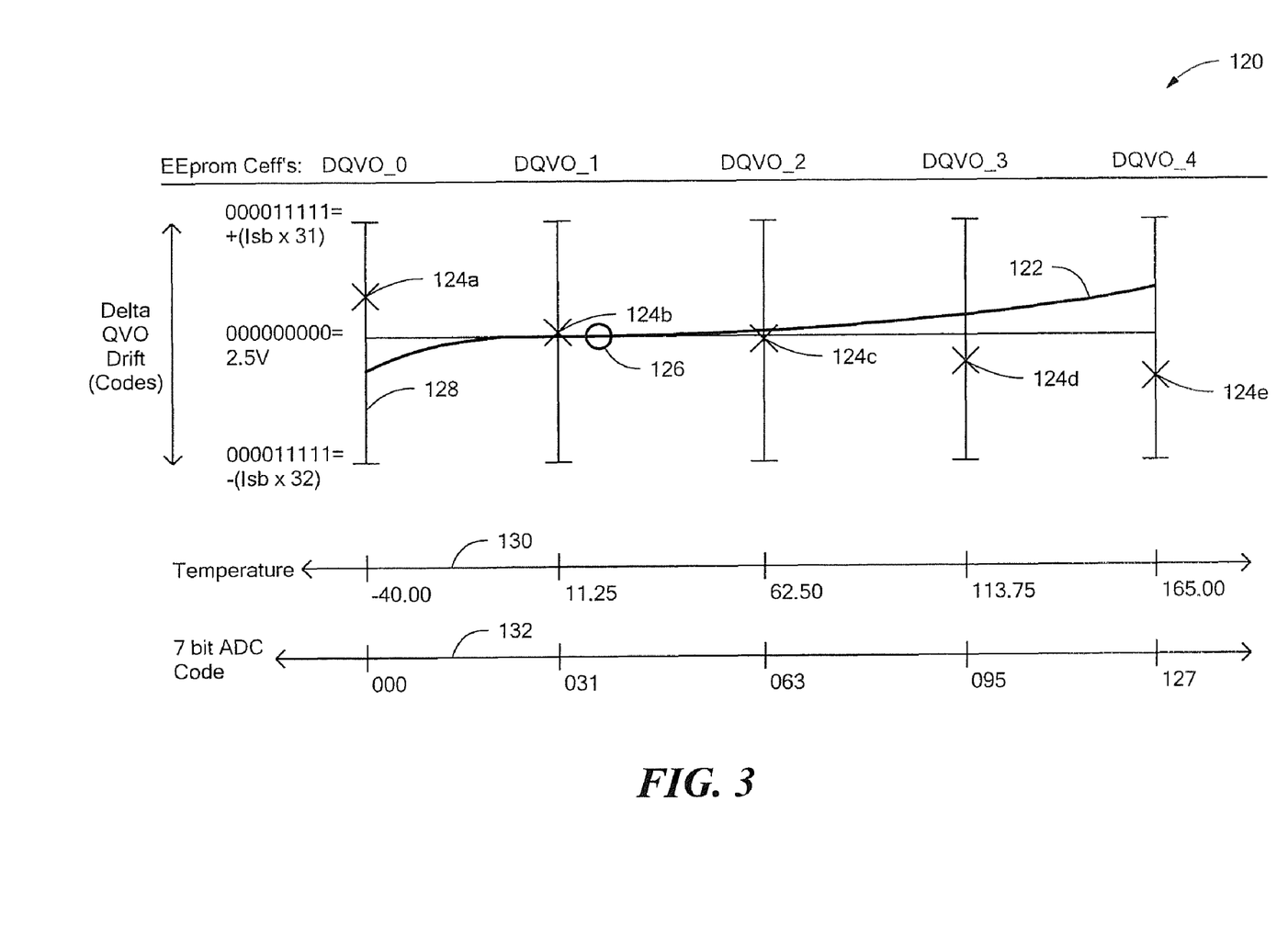
FIG. 3 is a graph showing an exemplary characteristic curve of offset versus temperature of a magnetic field sensor and showing offset correction coefficients.

Referring now to FIG. 3, a graph 100 has a vertical axis 128 with a scale in units of DC offset voltage change in linear units represented by a nine bit digital value. A first horizontal axis 130 has a scale in units of temperature in degrees Celsius experienced by a magnetic field sensor (i.e., by the temperature sensor 30 of FIG. 1) and a second horizontal axis 132 has a scale in units corresponding to a seven bit digital code representative of temperature, but in decimal units from zero to one hundred twenty seven. The axis 132 corresponds to the digital temperature signal 32a of FIG. 1.

A characteristic curve 122 is representative of a relative offset (relative to offset at room temperature 126) of a magnetic field sensor having no offset correction values applied. It can be seen that the offset represented by the characteristic curve 122 tends to be in one direction at low temperatures relative to the offset (nominally 2.5V) at room temperature and tends to be in the other direction at high temperatures relative to the offset at room temperature.

At a first temperature, −40 degrees Celsius, an offset correction coefficient 124a (DQVO_0) is opposite from the relative offset drop of the characteristic curve 122. It will be understood that the offset correction coefficient 124a can be applied to the magnetic field sensor when the magnetic field sensor experiences the temperature of −40 degrees, resulting in essentially no offset change from the offset (2.5V) at room temperature 106. Similarly, other offset correction coefficients 124b, 124c, 124d, 124e (DQV_1, DQVO_2, DQVO_3, DQVO_4, respectively) can be applied at other temperatures with which they are associated (11.25, 62.5, 113.75, 165.00 degrees Celsius, respectively) in order to provide no offset change from the offset at room temperature 106 at those particular temperatures.

As in FIG. 2, five temperature segments are shown, namely −40.00 to 11.25, 11.25 to 62.5, 62.5 to 113.75, and 113.75 to 165.00 degrees Celsius.

Within any temperature segment, e.g., the temperature segment 11.25 to 62.5, identified in accordance with an actual measured temperature experienced by the magnetic field sensor as represented by the digital temperature signal 32a of FIG. 1, the interpolation processor 36 (FIG. 1) can interpolate between the offset correction coefficients (e.g., 124b, 124c) associated with boundaries of the temperature segment to establish an interpolated offset correction value (e.g., 36b, FIG. 1) to be used at the particular measured temperature. The interpolated offset correction value can be applied to the magnetic field sensor to keep the offset of the magnetic field sensor essentially unchanged from the offset at room temperature 106.

As shown and described above, the offset interpolation can be a linear interpolation. However in other embodiments, the offset interpolation can be of another form, for example, a quadratic interpolation.

While five offset correction coefficients 124a-124e are shown and five associated temperature segments, in other embodiments, there can be more than five or fewer than five offset correction coefficients and associated temperature segments. The number of offset correction coefficients and associated temperature segments can be selected according to a desired offset accuracy and according to a desired largest physical size of the EEPROM 52 (FIG. 1) that stores the offset correction coefficients. In general, the greater the number of offset correction coefficients that are stored in the EEPROM 52, the more accurate will be the interpolated offset correction coefficients and the more accurate will be the corrected relative offset of the magnetic field sensor.

While the temperature segments are shown to be equal in numbers of degrees, in other embodiments, the temperature segments can have an unequal number of degrees. For example, in some embodiments, temperature segments near to room temperature 106 can have a larger (or smaller) temperature span than temperature segments further from room temperature 106.

Each individual magnetic field sensor of a particular type can have different offset correction coefficients 124a-124e generated by a process more fully described below in conjunction with FIG. 5. However, in some embodiments, each one of a particular type of magnetic field sensor can have the same offset correction coefficients 124a-124e.

As further described below in conjunction with FIG. 5, some of (or all of) the offset correction coefficients 124a-124e can be selected (i.e., measured) during production of the magnetic field sensor (or thereafter) by direct measurements of relative offset at the plurality of temperatures of the specific one of the magnetic field sensors in which the specific offset correction coefficients 124a-124e are stored. However in some embodiments, fewer than all of the offset correction coefficients 124a-124e result from direct measurements and other ones of the offset correction coefficients 124a-124e are derived from the offset characteristic curve 122. In other words, for example, the offset correction coefficient 124a can be generated by a relative offset measurement at −40.00 degrees and at room temperature 106, and other ones of the offset correction coefficients 124b-124e can be deduced by knowledge of a shape of the offset characteristic curve 122.

The characteristic curve 122 as shown can be representative of an average offset characteristic taken from a plurality of the same type of magnetic field sensor. Other types of magnetic field sensors can have offset characteristic curves with other shapes.

In using the offset characteristic curve 122 to derive some (or all) of the offset correction coefficients 124a-124e for a particular magnetic field sensor, it should be understood that the offset characteristic curve 122 can keep the same shape common to all of the same type of magnetic field sensors, but can be scaled up or down in magnitude for each individual magnetic field sensor of the same type. For example, if the relative offset of an individual magnetic field sensor is measured at room temperature and also at −40 degrees, and if the relative offset at −40 degrees is lower than that represented by the characteristic curve 122, it can be presumed that the characteristic curve of the magnetic field sensor being measured curves more downward at −40 degrees and more upward at 165 degrees, but otherwise maintains the same shape. Thus, by making only a room temperature offset measurement and also a relative offset measurement at any other temperature (relative to offset at room temperature), a characteristic curve similar to (same shape as) the characteristic curve 122 (but with different scaling) can be derived and the other offset correction coefficients can be deduced.

It will be understood that the particular shape of the offset characteristic curve 122 depends upon the particular type magnetic field sensor. Furthermore, the characteristic curve 122 can be slightly different (e.g., different scaling) for different specific ones of the particular type of magnetic field sensor. Therefore, it may be advantageous to characterize a plurality of different specific ones of the particular type of magnetic field sensor, and take an average in order to identify the shape of the offset characteristic curve 122, which can thereafter be scaled up or down to suit each individual magnetic field sensor of the same type.

From the above examples of FIGS. 2 and 3, it can be seen that in one embodiment, there are five gain correction coefficients associated with five temperatures and, five offset correction coefficients associated with the same five temperatures. However, the gain correction coefficients and the offset correction coefficients need not be associated with the same temperatures. The EEPROM 52 of FIG. 1 is shown to store the exemplary five gain correction coefficients (TDSense0 to TDSense4) and the five exemplary offset correction coefficients (DQVO_0 to DQVO_4).

Figure 4:
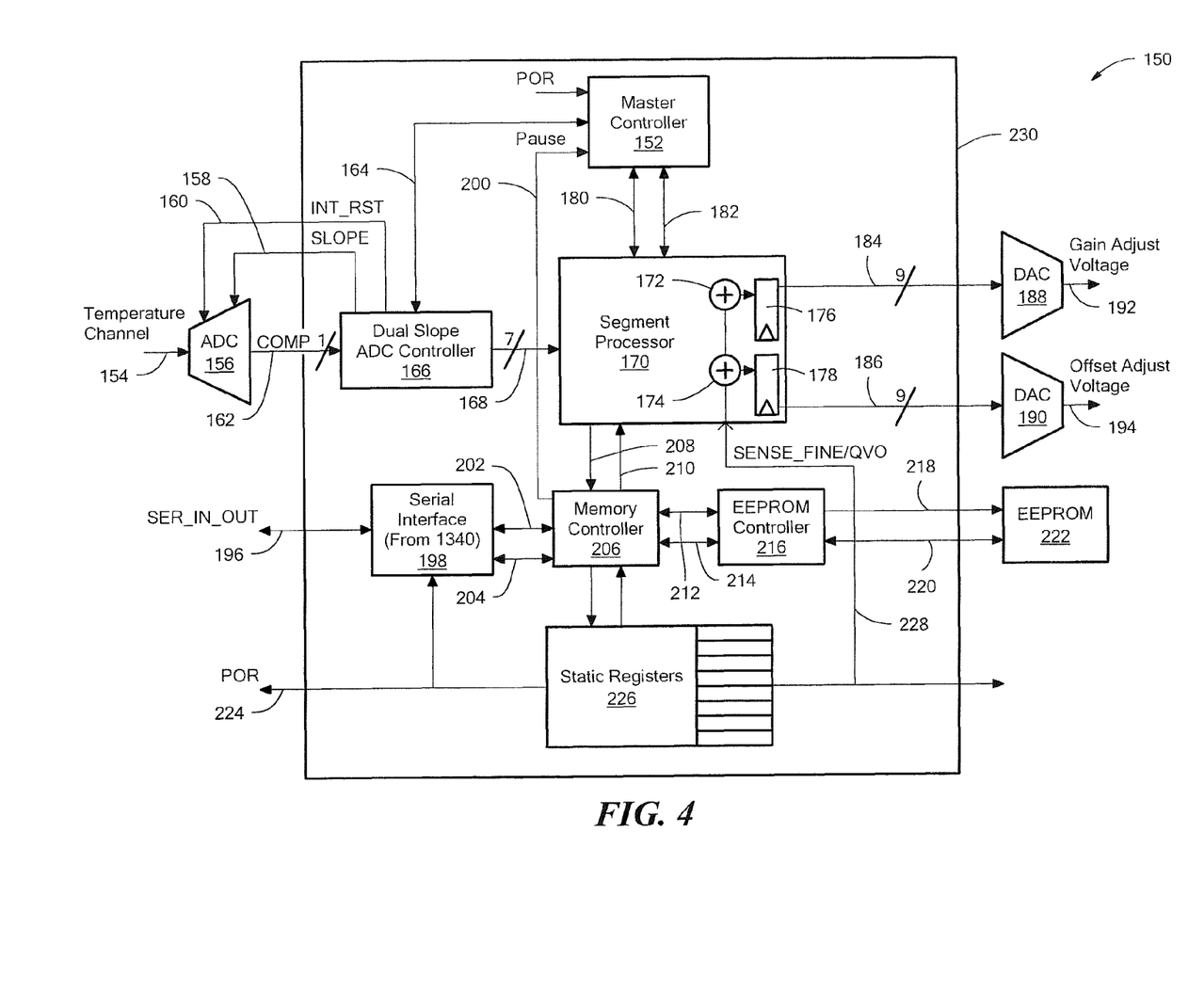
FIG. 4 is a block diagram showing details of the segment processor of the magnetic field sensor of FIG. 1.

Referring now to FIG. 4, a circuit 150 shows further details of the parts of magnetic field sensor 10 of FIG. 1.

An ADC 156 corresponds to the ADC 32 of FIG. 1. The ADC 156 is coupled to receive an analog signal 154 that corresponds to the temperature signal 30a of FIG. 1. The ADC 156 is configured to generate a signal 162 that corresponds to the digital temperature signal 32a of FIG. 1.

A segment processor 170 corresponds to the segment processor 34 of FIG. 1. A multiplier and a summer 172, 174, respectively, within the segment processor 170, correspond to the combining processor 38 of FIG. 1. As described above, it will be understood from equations above that a user gain correction value (54a, FIG. 1) is applied via a multiplication and a user offset correction value (56a, FIG. 1) is applied via a sum. A register 176 within the segment processor 170 corresponds to the gain adjust register 40 of FIG. 1. A register 178 within the segment processor 170 corresponds to the offset adjust register 42 of FIG. 1.

DACS 188, 190 correspond to the DACS 44, 46, respectively, of FIG. 1. The DAC 188 is coupled to receive a signal 184 from the segment processor 170, which signal corresponds to the signal 40a of FIG. 1. The DAC 190 is coupled to receive a signal 186 from the segment processor 170, which signal corresponds to the signal 42a of FIG. 1.

An EEPROM 222 corresponds to the coefficient table EEPROM 52 of FIG. 1. A bidirectional signal 220 from the EEPROM 222 corresponds to the selected pairs of gain correction values 52a and the selected pairs of offset correction values 52a, 52b, respectively, of FIG. 1, and also to a selection signal to the EEPROM 222 not shown in FIG. 1 that selects the desired pair of gain correction values and the desired pairs of offset correction values in accordance with an identified temperature segment in which the digital temperature signal 162 lies. A signal 218 to the EEPROM 222 corresponds to a read/write control line to the EEPROM 222.

Static registers 226 correspond to the user gain correction value EEPROM 54, the user offset correction value EEPROM 56 and the program control EEPROM 50 of FIG. 1. A signal 228 from the static registers 226 correspond to the user gain correction value 54a and the user offset correction value 56a of FIG. 1.

A serial_in_out communication link 196 corresponds to the communication link 48 of FIG. 1.

A serial interface circuit 198 can be coupled to the serial communication link 196 and can understand one or more serial communication protocols in order to receive data from the serial communication link 196. In some embodiments, the serial communication protocol is an automotive serial communication protocol, for example, a CAN communication protocol.

The circuit 230 can include a memory controller 206 coupled to the serial interface circuit 198 with control and data signals 202, 204. The circuit 230 can also include an EEPROM controller 216 coupled to the memory controller 206 with data and control signal 212, 214. The EEPROM controller 216 can be coupled to the EEPROM 222 with the signals 218, 220 described above.

The circuit 230 can also include a master controller 152, e.g., a programmable processor, coupled with data and control signals 180, 182 to the segment processor 170.

In some embodiments, the circuit 230 can also include a dual slope ADC controller 166 coupled with control lines 158, 160 to the ADC 156. The dual slope ADC controller 166 can be configured to change a slope (i.e., a range) of the ADC 156 upon user control.

As shown, in some embodiments, a digital temperature signal 168 can have seven bits, the signal 184 can have nine bits, and the signal 186 can have nine bits.

A power on reset signal (POR) 224 can distribute within the circuit 230 to reset function and various registers upon power up of the circuit 230.

All of the circuit 150, and/or all of the magnetic field sensor 10 of FIG. 1, can be on a common integrated circuit substrate.

Figure 5:
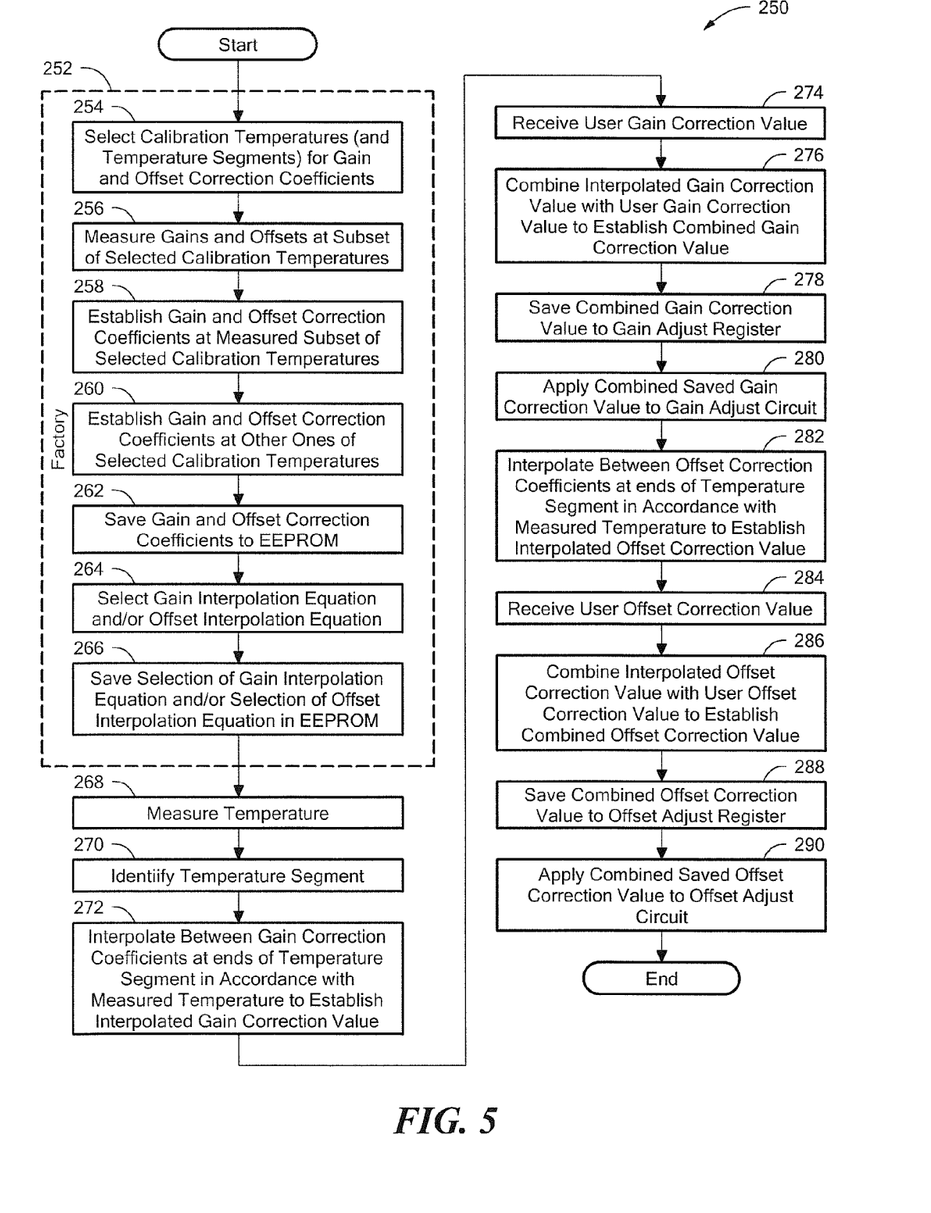
FIG. 5 is a flow chart showing a process to correct gain and/or offset versus temperature of the magnetic field sensor of FIG. 1.

It should be appreciated that FIG. 5 show a flowchart corresponding to the below contemplated technique that would be implemented in circuit 10 (FIG. 1). Rectangular elements (typified by element 254 in FIG. 2), herein denoted "processing blocks," represent computer software instructions or groups of instructions. Diamond shaped elements (none shown), herein denoted "decision blocks," represent computer software instructions, or groups of instructions, which affect the execution of the computer software instructions represented by the processing blocks.

The processing and decision blocks can represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 5, an exemplary method 250 begins at a set of blocks 252 that can be performed in a factory upon manufacture of the magnetic field sensor 10 of FIG. 1. At block 252, a set of calibration temperatures and associated temperature segments are selected. In the examples given above in conjunction with FIGS. 1-3, there can be five selected temperatures, e.g., −40.00, 11.25, 62.5, 113.75, and 165.00 degrees Celsius and five associate temperature segments bounded by adjacent pairs of the selected temperatures. However, as described above there can be more than five or fewer than five selected temperatures and associated temperature segments, and the selected temperatures need not be evenly spaced.

At block 256, relative gains and relative offsets (relative to gain and offset at room temperature) can be measured either at all of the selected temperatures, or at a subset of the selected temperatures, for example, only at −40.00 degrees Celsius.

At block 258, based upon the relative sensitivity measurement(s), gain and offset correction coefficients are established for the temperature(s) at which measurements were taken. The gain and offset correction coefficients can be opposite from the measured relative sensitivity and relative offset deviations.

At block 260, other gain and offset correction coefficients can be established for the selected temperatures at which direct measurements of relative sensitivity and offset are not taken for the specific magnetic field sensor under consideration. As described above, the establishment of the other gain and offset correction coefficients can be made in accordance with generation of a sensitivity characteristic curve and/or an offset characteristic curve, using knowledge of the shape of the curves as derived from an average of measurements of a plurality of magnetic field sensors of the same type. Using the same shape, the sensitivity (gain) characteristic curve and the offset characteristic curve can have the same shape as the average of the measurements, but can be scaled up or down in magnitude according to the sensitivity and offset measurement(s) made block 256.

At block 262, the gain and offset correction coefficients (e.g., five gain correction coefficients and five offset correction coefficients) are stored within the magnetic field sensor, for example, within the EEPROM 52 of FIG. 1 via a serial communication link, for example, the communication link 48 of FIG. 1

At block 264, in some embodiments, a gain interpolation equation and/or an offset interpolation type (equation) can be selected from among a plurality of interpolation types. See equations 1, 3, 4, and 5 above.

At block 266, the selection of the interpolation types can be saved as a value, for example, in the EEPROM 50 of FIG. 1 via the serial communication link, for example, the communication link 48 of FIG. 1.

The remaining blocks of the process 250 can be performed by the magnetic field sensor when in the field in normal operation, either continuously or from time to time.

At block 268, the magnetic field sensor measures its temperature, for example, via the temperature sensor 30 of FIG. 1.

At block 270, the magnetic field sensor identifies in which one of the temperature segments selected at block 254 the measured temperature resides.

At block 272, the magnetic field sensor, for example, the interpolation processor 272 of FIG. 1, interpolates, in accordance with the measured temperature, between gain correction coefficients stored at block 262 that bound the identified temperature segment. An interpolated gain correction value (e.g., 36a of FIG. 1) is thus established. The interpolation can be in accordance with equation 1 above.

At block 274 or earlier, the magnetic field sensor can receive a user gain correction value, for example the value 54a stored in the user gain correction value EEPROM 54 of FIG. 1 via the communication link 48 of FIG. 1. In some embodiments, the user gain correction value is used to merely adjust a sensitivity of the magnetic field sensor between factors of 0.75 and 1.25 according to user preference.

At block 276, the interpolated gain correction value is combined with the user gain correction value (e.g., by the combining processor 38 of FIG. 1) to establish a combined gain correction value (e.g., 38a of FIG. 1).

At block 278, the combined gain correction value is stored, for example, in the gain adjust register 40 of FIG. 1.

At block 280 the saved gain correction value is applied to the magnetic field sensor to adjust its sensitivity (i.e., gain) via the DAC 44 and the gain adjust circuit 26 of FIG. 1.

At block 282, the magnetic field sensor, for example, the interpolation processor 272 of FIG. 1, interpolates, in accordance with the measured temperature, between offset correction coefficients stored at block 262 that bound the identified temperature segment. An interpolated offset correction value (e.g., 36b of FIG. 1) is thus established. The interpolation can be in accordance with equation 3 above.

At block 284 or earlier, the magnetic field sensor can receive a user offset correction value, for example the value 56a stored in the user offset correction value EEPROM 56 of FIG. 1 via the communication link 48 of FIG. 1.

At block 286, the interpolated offset correction value is combined with the user offset correction value (e.g., by the combining processor 38 of FIG. 1) to establish a combined offset correction value (e.g., 38b of FIG. 1).

At block 288, the combined offset correction value is stored, for example, in the offset adjust register 42 of FIG. 1.

At block 290 the saved offset correction value is applied to the magnetic field sensor to adjust its offset via the DAC 46 and the offset adjust circuit 28 of FIG. 1.

With the above-described technique, the magnetic field sensor can maintain a sensitivity and an offset that do not change or that change very little with respect to temperature of the magnetic field sensor compared to the sensitivity and offset of the magnetic field sensor at room temperature.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   a magnetic field sensing element configured to generate a magnetic field signal;
   a gain adjustable analog circuit coupled to receive a signal representative of the magnetic field signal, coupled to receive a gain control signal, and configured to generate a gain adjusted signal having a gain responsive to the gain control signal;
   a coefficient table memory configured to receive and store a plurality of gain correction coefficients, wherein pairs of the plurality of gain correction coefficients are associated with boundaries of respective temperature segments, each temperature segment bounded by a pair of temperatures;
   a temperature sensor configured to generate a temperature signal representative of a temperature; and
   a segment processor coupled to receive a signal representative of the temperature signal, configured to identify a temperature segment in which the temperature signal falls, coupled to receive a pair of gain correction coefficients associated with the identified temperature segment, and configured to interpolate between the pair of gain correction coefficients in accordance with the temperature signal to generate an interpolated gain correction value, wherein the gain control signal is an analog signal related to the interpolated gain correction value.

2. The magnetic field sensor of claim 1, further comprising a user gain correction value register coupled to receive a user gain correction value, wherein the segment processor comprises a combining processor coupled to receive the user gain correction value, coupled to receive the interpolated gain correction value, and configured to combine the user gain correction value with the interpolated gain correction value to generate a combined gain correction value, wherein the gain control signal is an analog signal related to the combined gain correction value.

3. The magnetic field sensor of claim 1, further comprising:
   an offset adjustable analog circuit coupled to receive a signal representative of the magnetic field signal, coupled to receive an offset control signal, and configured to generate an offset adjusted signal having an offset responsive to the offset control signal,
      wherein the coefficient table memory is further configured to receive and store a plurality of offset correction coefficients, wherein pairs of the plurality of offset correction coefficients are associated with boundaries of respective temperature segments,
      wherein the segment processor is further coupled to receive a pair of offset correction coefficients associated with the identified temperature segment and configured to interpolate between the pair of offset correction coefficients in accordance with the temperature signal to generate an interpolated offset correction value, and wherein the offset control signal is an analog signal related to the interpolated offset correction value.

4. The magnetic field sensor of claim 3, further comprising a user gain correction value register coupled to receive a user gain correction value, wherein the segment processor comprises a combining processor coupled to receive the user gain correction value and coupled to receive the interpolated gain correction value and configured to combine the user gain correction value with the interpolated gain correction value to generate a combined gain correction value, wherein the gain control signal is an analog signal related to the combined gain correction value.

5. The magnetic field sensor of claim 4, further comprising a user offset correction value register coupled to receive a user offset correction value, wherein the combining processor is further coupled to receive the user offset correction value and coupled to receive the interpolated offset correction value and further configured to combine the user offset correction value with the interpolated offset correction value to generate a combined offset correction value, wherein the offset control signal is an analog signal related to the combined offset correction value.

6. The magnetic field sensor of claim 1, further comprising a program control register coupled to receive a program control value, wherein the segment processor is coupled to receive a signal representative of the program control value, and, in response to the program control value, the segment processor is configured to select an interpolation type from among a plurality of predetermined interpolation types.

7. A method of adjusting a magnetic field sensor, comprising:
measuring a temperature with the magnetic field sensor during field operation;
identifying with the magnetic field sensor in which one of a predetermined plurality of temperature segments the field measured temperature lies;
identifying with the magnetic field sensor a pair of predetermined calibration temperatures associated with boundaries of the identified temperature segment;
identifying with the magnetic field sensor a pair of gain calibration coefficients associated with the boundaries of the identified temperature segment, the pair of gain calibration coefficients stored within the magnetic field sensor;
interpolating with the magnetic field sensor between the pair of gain calibration coefficients to establish an interpolated gain correction value; and
applying an analog signal related to the interpolated gain correction value to a gain adjustment circuit within the magnetic field sensor.

8. The method of claim 7, further comprising:
receiving a user gain correction value with the magnetic field sensor;
combining with the magnetic field sensor the interpolated gain correction value and the user gain correction value to generate a combined gain correction value; and
applying an analog signal related to the combined gain correction value to the gain adjustment circuit.

9. The method of claim 7, further comprising:
identifying with the magnetic field sensor a pair of offset calibration coefficients associated with the boundaries of the identified temperature segment, the pair of offset calibration coefficients stored within the magnetic field sensor;
interpolating with the magnetic field sensor between the pair of offset calibration coefficients to establish an interpolated offset correction value; and
applying an analog signal related to the interpolated offset correction value to an offset adjustment circuit within the magnetic field sensor.

10. The method of claim 9, further comprising:
receiving a user gain correction value with the magnetic field sensor;
combining with the magnetic field sensor the interpolated gain correction value and the user gain correction value to generate a combined gain correction value; and
applying an analog signal related to the combined gain correction value to the gain adjustment circuit.

11. The method of claim 10, further comprising:
receiving a user offset correction value with the magnetic field sensor;
combining with the magnetic field sensor the interpolated offset correction value and the user offset correction value to generate a combined offset correction value; and
applying an analog signal related to the combined offset correction value to the offset adjustment circuit.

12. The method of claim 7, further comprising:
receiving a program control value with the magnetic field sensor; and
selecting with the magnetic field sensor an interpolation type from among a plurality of predetermined interpolation types in response to the program control value.

13. The method of claim 7, further comprising:
measuring, during production of the magnetic field sensor, gains of the magnetic field sensor at a subset of the selected plurality of calibration temperatures;
establishing gain correction coefficients at the subset of the plurality of calibration temperatures in accordance with the measurements;
establishing additional gain correction coefficients at the other ones of the selected plurality of calibration temperatures; and
storing the gain correction coefficients and the additional gain correction coefficients in the magnetic field sensor.

14. The method of claim 13, wherein the establishing the additional gain correction coefficients comprises:
characterizing gain versus temperature of a plurality of magnetic field sensors.

15. The method of claim 13, further comprising:
measuring, during production of the magnetic field sensor, offsets of the magnetic field sensor at the subset of the selected plurality of calibration temperatures;
establishing offset correction coefficients at the subset of the plurality of calibration temperatures in accordance with the measurements;
establishing additional offset correction coefficients at the other ones of the selected plurality of calibration temperatures; and
storing the offset correction coefficients and the additional offset correction coefficients in the magnetic field sensor.

16. The method of claim 15, wherein the establishing the additional offset correction coefficients comprises:
characterizing gain versus temperature of a plurality of magnetic field sensors; and
characterizing offset versus temperature of the plurality of magnetic field sensors.

17. A magnetic field sensor, comprising:
a magnetic field sensing element configured to generate a magnetic field signal;
an offset adjustable analog circuit coupled to receive a signal representative of the magnetic field signal, coupled to receive an offset control signal, and configured to generate an offset adjusted signal having an offset responsive to the offset control signal;
a coefficient table memory configured to receive and store a plurality of offset correction coefficients, wherein pairs of the plurality of offset correction coefficients are associated with boundaries of respective temperature segments, each temperature segment bounded by a pair of temperatures;

a temperature sensor configured to generate a temperature signal representative of a temperature; and a segment processor coupled to receive a signal representative of the temperature signal, configured to identify a temperature segment in which the temperature signal falls, coupled to receive a pair of offset correction coefficients associated with the identified temperature segment, and configured to interpolate between the pair of offset correction coefficients in accordance with the temperature signal to generate an interpolated offset correction value, wherein the offset control signal is an analog signal related to the interpolated offset correction value.

18. The magnetic field sensor of claim 17, further comprising a user offset correction value register coupled to receive a user offset correction value, wherein the segment processor comprises a combining processor coupled to receive the user offset correction value and coupled to receive the interpolated offset correction value and further configured to combine the user offset correction value with the interpolated offset correction value to generate a combined offset correction value, wherein the offset control signal is an analog signal related to the combined offset correction value.

19. A method of adjusting a magnetic field sensor, comprising:

measuring a temperature with the magnetic field sensor during field operation;

identifying with the magnetic field sensor in which one of a predetermined plurality of temperature segments the field measured temperature lies;

identifying with the magnetic field sensor a pair of predetermined calibration temperatures associated with boundaries of the identified temperature segment;

identifying with the magnetic field sensor a pair of offset calibration coefficients associated with the boundaries of the identified temperature segment, the pair of offset calibration coefficients stored within the magnetic field sensor;

interpolating with the magnetic field sensor between the pair of offset calibration coefficients to establish an interpolated offset correction value; and applying an analog signal related to the interpolated offset correction value to an offset adjustment circuit within the magnetic field sensor.

20. The method of claim 19, further comprising:

receiving a user offset correction value with the magnetic field sensor;

combining with the magnetic field sensor the interpolated offset correction value and the user offset correction value to generate a combined offset correction value; and applying an analog signal related to the combined offset correction value to the offset adjustment circuit.

* * * * *